(12) United States Patent
Hsu

(10) Patent No.: US 6,806,136 B1
(45) Date of Patent: Oct. 19, 2004

(54) METHOD OF FORMING A SEMICONDUCTOR DEVICE HAVING A CAPACITOR AND A RESISTOR

(75) Inventor: Hsiu-Wen Hsu, Sinfong (TW)

(73) Assignee: Episil Technologies, Inc., Hsin-Chu (TW)

( * ) Notice: Subject to any disclaimer, the term of this patent is extended or adjusted under 35 U.S.C. 154(b) by 0 days.

(21) Appl. No.: 10/780,416

(22) Filed: Feb. 17, 2004

(51) Int. Cl.⁷ .......................................... H01L 21/8234
(52) U.S. Cl. ...................... 438/238; 438/210; 438/381
(58) Field of Search ................................ 438/171, 210, 438/238, 381

(56) References Cited

U.S. PATENT DOCUMENTS

| | | | |
|---|---|---|---|
| 5,434,098 A | 7/1995 | Chang | 437/60 |
| 5,618,749 A | 4/1997 | Takahashi et al. | 438/384 |
| 5,656,524 A | 8/1997 | Eklund et al. | 438/238 |
| 6,246,084 B1 | 6/2001 | Kim | 257/296 |
| 6,323,079 B1 * | 11/2001 | Takeshita | 438/238 |

* cited by examiner

Primary Examiner—Jack Chen
(74) Attorney, Agent, or Firm—George O. Saile; Stephen B. Ackerman; Stephen G. Stanton

(57) ABSTRACT

The present invention relates generally to semiconductor fabrication and more specifically to simultaneous formation of capacitors, resistors and metal oxide semiconductor.

31 Claims, 2 Drawing Sheets

US 6,806,136 B1

METHOD OF FORMING A SEMICONDUCTOR DEVICE HAVING A CAPACITOR AND A RESISTOR

FIELD OF THE INVENTION

The present invention relates generally to semiconductor fabrication and more specifically to simultaneous formation of capacitors, resistors and metal-oxide semiconductors.

BACKGROUND OF THE INVENTION

Analog integrated circuits may include active elements such as metal-oxide semiconductors and passive elements such as capacitors and resistors formed on a semiconductor substrate and interconnected by wiring patterns.

U.S. Pat. No. 6,246,084 B1 to Kim describes a method for fabricating a capacitor and resistor over a shallow trench isolation (STI) structure.

U.S. Pat. No. 5,618,749 to Takahashi et al. describes another method for fabricating a capacitor and resistor over a shallow trench isolation (STI) structure.

U.S. Pat. No. 5,434,098 to Chang describes a capacitor process with an interpoly oxide (IPO) layer.

U.S. Pat. No. 5,656,524 to Eklund et al. describes a method of forming a polysilicon resistor.

SUMMARY OF THE INVENTION

Accordingly, it is an object of one or more embodiments of the present invention to provide improved methods of simultaneously forming a capacitor(s) and resistor(s) on a field oxide film and a metal-oxide semiconductor(s) on a semiconductor substrate.

Other objects will appear hereinafter.

It has now been discovered that the above and other objects of the present invention may be accomplished in the following manner. Specifically, a structure having: an exposed oxide structure; a capacitor region within at least a portion of the exposed oxide structure; a first resistor region within at least a portion of the exposed oxide structure; a second resistor region within at least a portion of the exposed oxide structure; and a metal-oxide semiconductor region not within at least a portion of the exposed oxide structure is provided. A first polysilicon layer is formed over the structure and the exposed oxide structure. The first polysilicon layer is doped to form a doped first polysilicon layer. An interpoly oxide film is formed over the doped first polysilicon layer. The interpoly oxide firm is patterned to form: a capacitor interpoly oxide film portion within the capacitor region over the oxide structure; and a second interpoly oxide film portion within the second resistor region over the oxide structure. A second polysilicon layer is formed over the structure. The second polysilicon layer is doped to form a doped second polysilicon layer. The doped second polysilicon layer and the doped first polysilicon layer are patterned to form: within the capacitor region: a lower capacitor doped first polysilicon portion underneath at least a portion of the capacitor interpoly oxide film portion, and an overlying upper capacitor second doped polysilicon portion over at least a portion of the patterned capacitor interpoly oxide film portion; within the first resistor region: a lower first resistor first polysilicon portion and an upper, overlying first resistor second polysilicon portion; within the second resistor region: a lower second resistor first polysilicon portion underneath at least a portion of the second interpoly oxide film portion; and within the metal-oxide semiconductor region: a lower metal-oxide semiconductor first polysilicon portion and an overlying metal-oxide semiconductor second polysilicon portion.

DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
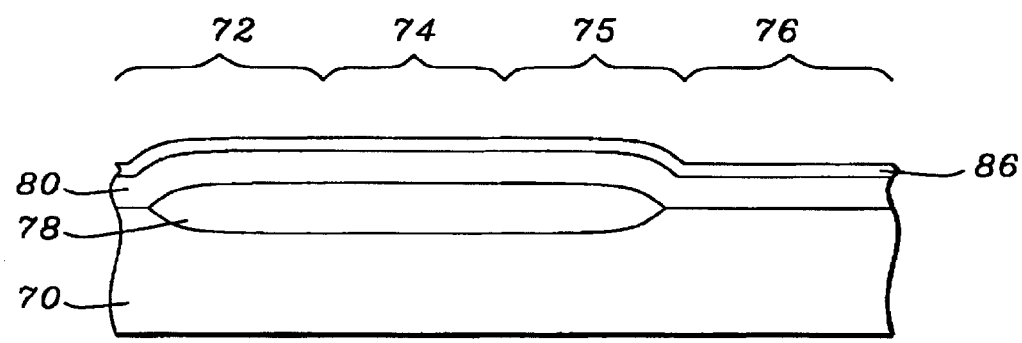
FIGS. 1 to 4 schematically illustrate a preferred embodiment of the present invention.

Initial Structure—FIG. 1

As shown in FIG. 1, structure 70 includes an exposed oxide structure 78 formed therein. Structure 70 includes a capacitor region 72 including at least a portion of the oxide structure 78, a first resistor region 74 including at least a portion of the oxide structure 78, a second resistor region 75 including at least a portion of the oxide structure 78 and a metal-oxide semiconductor (MOS) region 76 that does not include a portion of the oxide structure 78.

Oxide structure 78 is preferably a field oxide (FOX) film having a thickness of preferably from about 4000 to 7500 Å and more preferably from about 4000 to 5500 Å.

Structure 70 is preferably a silicon (Si), germanium (Ge) or gallium arsenide (GaAs) substrate, is more preferably a silicon substrate.

A first polysilicon layer 80 is formed over structure 70 and exposed oxide structure 78 to a thickness of preferably from about 1000 to 2500 Å and more preferably from about 1500 to 2000 ÅA. The first polysilicon layer 80 is then doped, preferably with phosphorus (P) or arsenic (As) and more preferably with phosphorus (P) to a concentration of preferably from about 1E16 to 1E21 atoms/cm$^2$ and more preferably from about 1E18 to 1E20 atoms/cm$^2$.

An interpoly oxide (IPO) film 86 is formed over the doped first polysilicon layer 80 to a thickness of preferably from about 250 to 600 Å and more preferably from about 300 to 450 Å.

Figure 2:
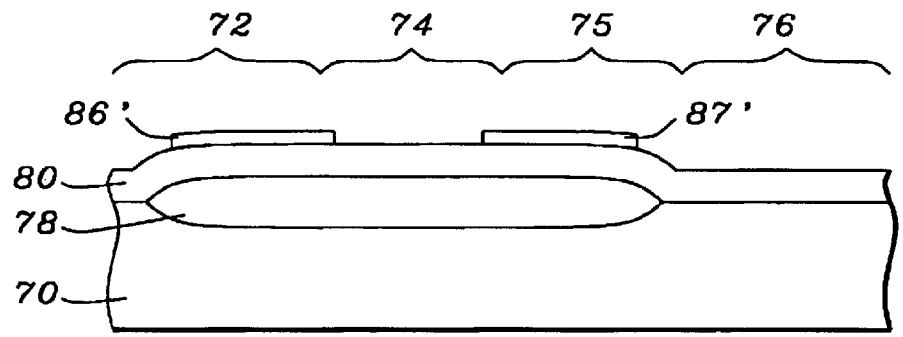

Patterning of IPO Film 86—FIG. 2

As shown in FIG. 2, the IPO film 86 is patterned to form:

a capacitor IPO film portion 86' within the capacitor region 72 over the oxide structure 78; and a second IPO film portion 87' within the second resistor region 75 over the oxide structure 78.

Figure 3:
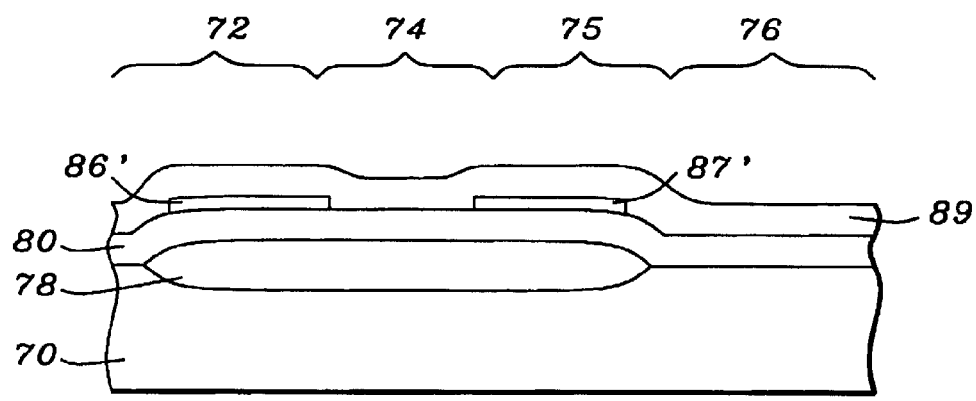

Formation of Second Polysilicon Layer 89—FIG. 3

As shown in FIG. 3, a second polysilicon layer 89 is formed over first doped polysilicon layer 80 and IPO film portions 86', 87' to a thickness of preferably from about 1000 to 2500 Å and more preferably from about 1500 to 2000 Å. The second polysilicon layer 89 is then doped, preferably with phosphorus (P) or arsenic (As) and more preferably with phosphorus (P) to a concentration of preferably from about 1E19 to 1E21 atoms/cm$^2$ and more preferably from about 5E19 to 5E20 atoms/cm$^2$.

Figure 4:
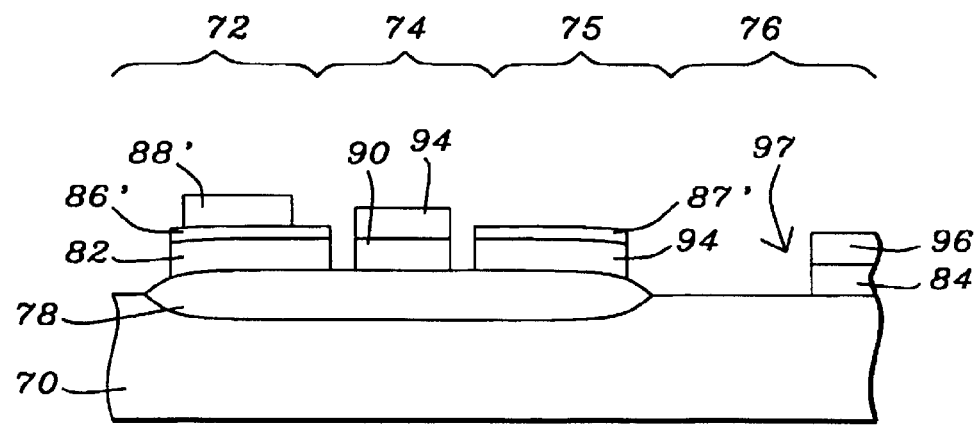

Patterning of Second Doped Polysilicon Layer 89 and First Doped Polysilicon Layer 80—FIG. 4

As shown in FIG. 4, the second doped polysilicon layer 89 and first doped polysilicon layer 80 are patterned to form:

within capacitor region 72: a lower capacitor doped first polysilicon portion 82 underneath at least a portion of capacitor IPO film portion 86', and an overlying upper capacitor second doped polysilicon portion 88' over at least a portion of the patterned capacitor IPO film portion 86';

within first resistor region 74: a lower first resistor first polysilicon portion 90 and an upper, overlying first resistor second polysilicon portion 94;

within second resistor region 75: a lower second resistor first polysilicon portion 94 underneath at least a portion of second IPO film portion 87'; and within MOS region 76: a lower MOS first polysilicon portion 84 and an overlying MOS second polysilicon portion 96 that comprise a MOS electrode 97.

It is noted that one or more capacitors and/or MOSs; and two or more resistors may be formed in accordance with the teachings of the third embodiment of the present invention.

Further processing may then proceed.

Advantages of the Present Invention

The advantages of one or more embodiments of the present invention include:

1. the total thickness of the first polysilicon and second polysilicon is thinner than prior art, it can increase process throughput and save process cost;
2. the thickness of first polysilicon is thinner, so the topography is plainer than prior art, it is helpful to photo process due to the wider photo DOF window;
3. it is easy to integrate polycide module, we can use polycide (e.g. WSi) film to replace second polysilicon, and then we can implement a polycide gate process; and
4. there are two kinds of resistors, one is formed by first polysilicon, and the other one is formed by the combination of first and second polysilicon.

While particular embodiments of the present invention have been illustrated and described, it is not intended to limit the invention, except as defined by the following claims.

I claim:

1. A method of simultaneously forming at least one capacitor, at least two resistors and at least one metal-oxide semiconductor, comprising the steps of:

providing a structure having an exposed oxide structure; the structure having a capacitor region within at least a portion of the exposed oxide structure; a first resistor region within at least a portion of the exposed oxide structure; a second resistor region within at least a portion of the exposed oxide structure; and a metal-oxide semiconductor region not within at least a portion of the exposed oxide structure;

forming a first polysilicon layer over the structure and the exposed oxide structure;

doping the first polysilicon layer to form a doped first polysilicon layer;

forming an interpoly oxide film over the doped first polysilicon layer;

patterning the interpoly oxide film to form:
a capacitor interpoly oxide film portion within the capacitor region over the oxide structure; and
a second interpoly oxide film portion within the second resistor region over the oxide structure;

forming a second polysilicon layer over the structure;

doping the second polysilicon layer to form a doped second polysilicon layer; and patterning the doped second polysilicon layer and the doped first polysilicon layer to simultaneously form:
within the capacitor region: a lower capacitor doped first polysilicon portion underneath at least a portion of the capacitor interpoly oxide film portion, and an overlying upper capacitor second doped polysilicon portion over at least a portion of the patterned capacitor interpoly oxide film portion;
within the first resistor region: a lower first resistor first polysilicon portion and an upper, overlying first resistor second polysilicon portion;
within the second resistor region: a lower second resistor first polysilicon portion underneath at least a portion of the second interpoly oxide film portion; and
within the metal-oxide semiconductor region: a lower metal-oxide semiconductor first polysilicon portion and an overlying metal-oxide semiconductor second polysilicon portion.

2. The method of claim 1, wherein the structure is a substrate and the exposed oxide structure is a field oxide film.

3. The method of claim 1, wherein the structure is a substrate selected from the group consisting of a silicon substrate, a germanium substrate and a gallium arsenide substrate.

4. The method of claim 1, wherein the structure is a silicon substrate.

5. The method of claim 1, wherein the exposed oxide structure has a thickness of from about 4000 to 7500 Å, the first polysilicon layer has a thickness of from about 1000 to 2500 Å, the interpoly oxide film has a thickness of from about 250 to 600 Å, and the second polysilicon layer has a thickness of from about 1000 to 2500 Å.

6. The method of claim 1, wherein the exposed oxide structure has a thickness of from about 4000 to 5500 Å, the first polysilicon layer has a thickness of from about 1500 to 2000 Å, the interpoly oxide film has a thickness of from about 300 to 450 Å, and the second polysilicon layer has a thickness of from about 1500 to 2000 Å.

7. The method of claim 1, wherein the doped first polysilicon layer is doped with a phosphorus dopant or an arsenic dopant; and the doped second polysilicon layer is doped with a phosphorus dopant or an arsenic dopant.

8. The method of claim 1, wherein the doped first polysilicon layer is doped with a phosphorous dopant; and the doped second polysilicon layer is doped with a phosphorous dopant.

9. The method of claim 1, wherein the doped first polysilicon layer is doped to a concentration of from about 1E16 to 1E21 atoms/cm$^2$; and the doped second polysilicon layer is doped to a concentration of from about 1E19 to 1E21 atoms/cm$^2$.

10. The method of claim 1, wherein the doped first polysilicon layer is doped to a concentration of from about 1E18 to 1E20 atoms/cm$^2$; and the doped second polysilicon layer is doped to a concentration of from about 5E19 to 5E20 atoms/cm$^2$.

11. The method of claim 1, wherein one capacitor, two resistors and one metal-oxide semiconductor are formed.

12. A method of simultaneously forming at least one capacitor, at least two resistors and at least one metal-oxide semiconductor, comprising the steps of:

providing a substrate having an exposed oxide structure; the exposed oxide structure being a field oxide film; the substrate having a capacitor region within at least a portion of the exposed oxide structure; a first resistor region within at least a portion of the exposed oxide structure; a second resistor region within at least a portion of the exposed oxide structure; and a metal-oxide semiconductor region not within at least a portion of the exposed oxide structure;

forming a first polysilicon layer over the substrate and the exposed oxide structure;

doping the first polysilicon layer to form a doped first polysilicon layer;

forming an interpoly oxide film over the doped first polysilicon layer;

patterning the interpoly oxide film to form:
    a capacitor interpoly oxide film portion within the capacitor region over the oxide structure; and
    a second interpoly oxide film portion within the second resistor region over the oxide structure;

forming a second polysilicon layer over the substrate;

doping the second polysilicon layer to form a doped second polysilicon layer; and patterning the doped second polysilicon layer and the doped first polysilicon layer to simultaneously form:
    within the capacitor region: a lower capacitor doped first polysilicon portion underneath at least a portion of the capacitor interpoly oxide film portion, and an overlying upper capacitor second doped polysilicon portion over at least a portion of the patterned capacitor interpoly oxide film portion;
    within the first resistor region: a lower first resistor first polysilicon portion and an upper, overlying first resistor second polysilicon portion;
    within the second resistor region: a lower second resistor first polysilicon portion underneath at least a portion of the second interpoly oxide film portion; and
    within the metal-oxide semiconductor region: a lower metal-oxide semiconductor first polysilicon portion and an overlying metal-oxide semiconductor second polysilicon portion.

13. The method of claim 12, wherein the substrate is a silicon substrate, a germanium substrate or a gallium arsenide substrate.

14. The method of claim 12, wherein the substrate is a silicon substrate.

15. The method of claim 12, wherein the exposed oxide structure has a thickness of from about 4000 to 7500 Å, the first polysilicon layer has a thickness of from about 1000 to 2500 Å, the interpoly oxide film has a thickness of from about 250 to 600 Å, and the second polysilicon layer has a thickness of from about 1000 to 2500 Å.

16. The method of claim 12, wherein the exposed oxide structure has a thickness of from about 4000 to 5500 Å, the first polysilicon layer has a thickness of from about 1500 to 2000 Å, the interpoly oxide film has a thickness of from about 300 to 450 Å, and the second polysilicon layer has a thickness of from about 1500 to 2000 Å.

17. The method of claim 12, wherein the doped first polysilicon layer is doped with a phosphorus dopant or an arsenic dopant; and the doped second polysilicon layer is doped with a phosphorus dopant or an arsenic dopant.

18. The method of claim 12, wherein the doped first polysilicon layer is doped with a phosphorus dopant; and the doped second polysilicon layer is doped with a phosphorus dopant.

19. The method of claim 12, wherein the doped first polysilicon layer is doped to a concentration of from about 1E16 to 1E21 atoms/cm$^2$; and the doped second polysilicon layer is doped to a concentration of from about 1E19 to 1E21 atoms/cm$^2$.

20. The method of claim 12, wherein the doped first polysilicon layer is doped to a concentration of from about 1E18 to 1E20 atoms/cm$^2$; and the doped second polysilicon layer is doped to a concentration of from about 5E19 to 5E20 atoms/cm$^2$.

21. The method of claim 12, wherein one capacitor, two resistors and one metal-oxide semiconductor are formed.

22. A method of simultaneously forming at least one capacitor, at least two resistors and at least one metal-oxide semiconductor, comprising the steps of:

providing a structure having an exposed oxide structure having a thickness of from about 4000 to 7500 Å; the structure having a capacitor region within at least a portion of the exposed oxide structure; a first resistor region within at least a portion of the exposed oxide structure; a second resistor region within at least a portion of the exposed oxide structure; and a metal-oxide semiconductor region not within at least a portion of the exposed oxide structure;

forming a first polysilicon layer over the structure and the exposed oxide structure; the first polysilicon layer having a thickness of from about 1000 to 2500 Å;

doping the first polysilicon layer to form a doped first polysilicon layer;

forming an interpoly oxide film over the doped first polysilicon layer; the interpoly film having a thickness of from about 250 to 600 Å;

patterning the interpoly oxide film to form:
    a capacitor interpoly oxide film portion within the capacitor region over the oxide structure; and
    a second interpoly oxide film portion within the second resistor region over the oxide structure;

forming a second polysilicon layer over the structure; the second polysilicon layer having a thickness of from about 1000 to 2500 Å;

doping the second polysilicon layer to form a doped second polysilicon layer; and patterning the doped second polysilicon layer and the doped first polysilicon layer to simultaneously form:
    within the capacitor region: a lower capacitor doped first polysilicon portion underneath at least a portion of the capacitor interpoly oxide film portion, and an overlying upper capacitor second doped polysilicon portion over at least a portion of the patterned capacitor interpoly oxide film portion;
    within the first resistor region: a lower first resistor first polysilicon portion and an upper, overlying first resistor second polysilicon portion;
    within the second resistor region: a lower second resistor first polysilicon portion underneath at least a portion of the second interpoly oxide film portion; and
    within the metal-oxide semiconductor region: a lower metal-oxide semiconductor first polysilicon portion and an overlying metal-oxide semiconductor second polysilicon portion.

23. The method of claim 22, wherein the structure is a substrate and the exposed oxide structure is a field oxide film.

24. The method of claim 22, wherein the structure is a substrate selected from the group consisting of a silicon substrate, a germanium substrate and a gallium arsenide substrate.

25. The method of claim 22, wherein the structure is a silicon substrate.

26. The method of claim 22, wherein the exposed oxide structure has a thickness of from about 4000 to 5500 Å, the first polysilicon layer has a thickness of from about 1500 to 2000 Å, the interpoly oxide film has a thickness of from about 300 to 450 Å, and the second polysilicon layer has a thickness of from about 1500 to 2000 Å.

27. The method of claim 22, wherein the doped first polysilicon layer is doped with a phosphorus dopant or an arsenic dopant; and the doped second polysilicon layer is doped with a phosphorus dopant or an arsenic dopant.

28. The method of claim 22, wherein the doped first polysilicon layer is doped with a phosphorous dopant; and the doped second polysilicon layer is doped with a phosphorus dopant.

29. The method of claim 22, wherein the doped first polysilicon layer is doped to a concentration of from about 1E16 to 1E21 atoms/cm$^2$; and the doped second polysilicon layer is doped to a concentration of from about 1E19 to 1E21 atoms/cm$^2$.

30. The method of claim 22, wherein the doped first polysilicon layer is doped to a concentration of from about 1E18 to 1E20 atoms/cm$^2$; and the doped second polysilicon layer is doped to a concentration of from about 5E19 to 5E20 atoms/cm$^2$.

31. The method of claim 22, wherein one capacitor, two resistors and one metal-oxide semiconductor are formed.

* * * * *